(12) United States Patent
Liu et al.

(10) Patent No.: US 11,385,120 B2
(45) Date of Patent: Jul. 12, 2022

(54) STAGE-BY-STAGE MEASUREMENT, REGULATION AND DISTRIBUTION METHOD FOR DYNAMIC CHARACTERISTICS OF MULTI-STAGE COMPONENTS OF LARGE-SCALE HIGH-SPEED ROTARY EQUIPMENT BASED ON MULTI-BIASED ERROR SYNCHRONOUS COMPENSATION

(71) Applicant: Harbin Institute of Technology, Harbin (CN)

(72) Inventors: Yongmeng Liu, Harbin (CN); Jiubin Tan, Harbin (CN); Chuanzhi Sun, Harbin (CN)

(73) Assignee: HARBIN INSTITUTE OF TECHNOLOGY, Harbin (CN)

( * ) Notice: Subject to any disclaimer, the term of this patent is extended or adjusted under 35 U.S.C. 154(b) by 716 days.

(21) Appl. No.: 16/374,926

(22) Filed: Apr. 4, 2019

(65) Prior Publication Data
US 2020/0217738 A1 Jul. 9, 2020

(30) Foreign Application Priority Data
Jan. 7, 2019 (CN) .......................... 201910012295.7

(51) Int. Cl.
*G01M 1/16* (2006.01)
*B64F 5/60* (2017.01)
*G06F 30/20* (2020.01)

(52) U.S. Cl.
CPC ................ *G01M 1/16* (2013.01); *B64F 5/60* (2017.01); *G06F 30/20* (2020.01)

(58) Field of Classification Search
CPC .............. G01M 1/16; B64F 5/60; G06F 30/20
USPC ........................................................ 703/7
See application file for complete search history.

*Primary Examiner* — Brian S Cook
(74) *Attorney, Agent, or Firm* — IPro, PLLC

(57) ABSTRACT

The disclosure provides a stage-by-stage measurement, regulation and distribution method for dynamic characteristics of multi-stage components of large-scale high-speed rotary equipment. Firstly, a single-stage rotor circular contour measurement model is established, and the circular contour measurement model is simplified by using a distance from an ith sampling point of an ellipse to a geometry center to obtain a simplified circular contour measurement model. Then, actually measured circular contour data is taken into the simplified circular contour measurement model to determine a relationship between dynamic response parameters after rotor assembly and eccentricity errors as well as the amount of unbalance of all stages of rotors. Finally, a rotor speed is set according to the relationship between the dynamic response parameters after rotor assembly and the eccentricity errors as well as the amount of unbalance of all stages of rotors to obtain a critical speed parameter objective function.

3 Claims, 2 Drawing Sheets

STAGE-BY-STAGE MEASUREMENT, REGULATION AND DISTRIBUTION METHOD FOR DYNAMIC CHARACTERISTICS OF MULTI-STAGE COMPONENTS OF LARGE-SCALE HIGH-SPEED ROTARY EQUIPMENT BASED ON MULTI-BIASED ERROR SYNCHRONOUS COMPENSATION

TECHNICAL FIELD

The present invention relates to a stage-by-stage measurement, regulation and distribution method for dynamic characteristics of multi-stage components of large-scale high-speed rotary equipment based on multi-biased error synchronous compensation, and belongs to the technical field of mechanical assembly.

BACKGROUND ART

An aero-engine has an extremely complex mechanism, and operates in a high-temperature and high-speed environment. During the operation, it may subject to a variety of unbalanced excitations, including periodic excitations and non-periodic excitations, as well as self-unbalanced excitation and external unbalanced airflows, which directly or indirectly affect a high-speed vibration response of an aero-engine rotor, including amplitude, phase, critical speed, etc. According to statistics, 70% or above of aero-engine faults are related to vibration, and severe vibration may have a huge impact on the performance of the aero-engine. Therefore, the study and vibration control of a vibration mechanism have become a key issue in the development of the aero-engine.

The existing study and vibration control method for a vibration mechanism neither explicitly propose specific geometry parameter values that affect engine vibration, nor optimize the vibration of the aero-engine by means of mathematical derivation. Single-objective coaxiality optimization is performed alone, a coaxiality model was established without considering a rotation error around X and Y axes, the propagation and amplification effects of a single-stage rotor circular contour measurement error in the assembly process, unbalanced parameters and stiffness parameters, a high-speed vibration response measurement model has not been established, and a high-speed response to a multi-stage rotor of the aero-engine cannot be optimized.

SUMMARY OF THE INVENTION

In order to solve the problem of severe vibration of large-scale rotating machinery and to optimize a high-speed response to a multi-stage rotor of an aero-engine, the present invention proposes a stage-by-stage measurement, regulation and distribution method for dynamic characteristics of multi-stage components of large-scale high-speed rotary equipment based on multi-biased error synchronous compensation. Technical solutions adopted are as follows:

A stage-by-stage measurement, regulation and distribution method for dynamic characteristics of multi-stage components of large-scale high-speed rotary equipment based on multi-biased error synchronous compensation includes:

firstly, establishing a single-stage rotor five-parameter circular contour measurement model, which includes an eccentricity error of a single-stage rotor to be measured, a sensor probe offset, a sensor ball radius, a measurement plane tilt error and a sensor tilt error; when the eccentricity error is $e/r_0 < 10^{-3}$ with respect to a short axis of a fitted ellipse, simplifying the five-parameter circular contour measurement model by using a distance $r_i$ from an ith sampling point of the ellipse to a geometry center to obtain a simplified five-parameter circular contour measurement model; then, taking actually measured circular contour data into the simplified five-parameter circular contour measurement model to determine a relationship between dynamic response parameters after rotor assembly and eccentricity errors as well as the amount of unbalance of all stages of rotors; and finally, setting a rotor speed according to the relationship between the dynamic response parameters after rotor assembly and the eccentricity errors as well as the amount of unbalance of all stages of rotors to obtain a critical speed parameter objective function, the high-speed response critical speed parameters for n rotors assembly are optimized by adjusting assembly phases of all stages of rotors, so that a high-speed response to a multi-stage rotor of an aero-engine can be optimized.

Further, a specific process of the measurement, regulation and distribution method includes:

step 1, establishing a single-stage rotor five-parameter circular contour measurement model, a measurement equation of the five-parameter circular contour measurement model being:

$$\rho_i = \sqrt{(r+\Delta r_i + r_i)^2 - (d + e\sin(\theta_i - \alpha))^2} + e\cos(\theta_i - \alpha) - r \quad i=0,1,2,\ldots n-1$$

where $\rho_i$ is the distance from a sensor probe to a measured center of rotation, e is rotor eccentricity, $\theta_i$ is the sampling angle with respect to the center of rotation, $\alpha$ is rotor eccentricity angle, r is sensor ball radius, n is the number of sampling points, $r_i$ is the distance from an ith sampling point of a fitted ellipse to a geometry center, $\Delta r_i$ is rotor surface machining error, and d is sensor probe offset;

step 2, determining a distance $r_i$ from an ith sampling point of a fitted ellipse to a geometry center, an expression of the distance $r_i$ being:

$$r_i = r_0 \sqrt{\frac{\cos^2(\varphi_i - \beta)}{\cos^2(\gamma + \chi)} + \sin^2(\varphi_i - \beta)}$$

where $r_0$ is the short axis of the fitted ellipse, $\varphi_i$ is the sampling angle with respect to the geometry center, $\beta$ is the included angle between a projection of a geometry axis on a measurement plane and an initial measurement direction, $\gamma$ is the included angle between an axis of rotation and the geometry axis, and $\chi$ is sensor tilt angle;

step 3, when an eccentricity error is $e/r_0 < 10^{-3}$ with respect to the short axis of the fitted ellipse, expanding the measurement equation described in step 1 by power series to obtain a simplified five-parameter circular contour measurement model:

$$\begin{cases} \rho_i = e\cos(\theta_i - \alpha) + \Delta r_i + \xi_i - \frac{(d + e\sin(\theta_i - \alpha))^2}{2(r + \Delta r_i + \xi_i)} \\ \xi_i = r_0 \sqrt{\frac{\cos^2(\eta_i)}{\cos^2(\gamma + \chi)} + \sin^2(\eta_i)} \quad , i = 0, 1, 2, \ldots n-1; \\ \eta_i = \theta_i + \arcsin\left(\frac{d + e\sin(\theta_i - \alpha)}{r + r_0 + \Delta r_i}\right) - \beta \end{cases}$$

step 4, taking actually measured circular contour data into the simplified five-parameter circular contour measurement model, estimating a single-stage rotor eccentricity error by using the simplified five-parameter circular contour measurement model, so as to obtain influence of the single-stage rotor eccentricity error on the amount of unbalance after steering gear rotor assembly and determine an initial amount of unbalance for n rotors assembly, and then determining a relationship between dynamic response parameters after rotor assembly and eccentricity errors as well as the amount of unbalance of all stages of rotors through the initial amount of unbalance for n rotors assembly; and step 5, setting a rotor speed as a slow speed to obtain a critical speed parameter objective function, the high-speed response critical speed parameters for n rotors assembly are optimized by adjusting assembly phases of all stages of rotors, so that a high-speed response to a multi-stage rotor of an aero-engine can be optimized, where the slow speed is 50% of a maximum speed.

Further, the process of determining the relationship between dynamic response parameters after rotor assembly and eccentricity errors as well as the amount of unbalance of all stages of rotors in step 4 includes:

first step, determining the amount of unbalance of the nth-stage rotor caused by eccentricity errors of all stages of rotors, the amount of unbalance of the nth-stage rotor caused by the eccentricity errors of all stages of rotors being:

$$\begin{bmatrix} Ux_{0-n} \\ Uy_{0-n} \end{bmatrix} = \begin{bmatrix} m_{0-n} & 0 & 0 \\ 0 & m_{0-n} & 0 \end{bmatrix} \cdot \sum_{i=1}^{n} \left( \prod_{j=2}^{i} S_{rj-1} S_{xj-1} S_{yj-1} \right) S_{ri}(p_i + dp_i)$$

where $Ux_{0-n}$ is the amount of unbalance of a measurement plane of an assembled nth-stage rotor in an X-axis direction, $Uy_{0-n}$ is the amount of unbalance of the measurement plane of the assembled nth-stage rotor in a Y-axis direction, $m_{0-n}$ is the mass of the assembled nth-stage rotor, $p_i$ is the ideal position vector of a center of a radial measurement plane of an ith-stage rotor, $dp_i$ is the machining error vector of a center position of the radial measurement plane of the ith-stage rotor, $S_{ri}$ is the rotation matrix of the ith-stage rotor rotating around a Z axis for an angle $\theta_{ri}$, $S_{r1}$ is unit matrix, $S_{xj-1}$ is the rotation matrix of a j–1th-stage rotation stator reference plane rotating around an X axis for an angle $\theta_{xj-1}$, $S_{yj-1}$ is the rotation matrix of the j–1th-stage rotation stator reference plane rotating around a Y axis for an angle $\theta_{yj-1}$, $p_i$ is the ideal position vector of a center of a radial measurement plane of an ith-stage rotor, $dp_i$ is the machining error vector of a center position of the radial measurement plane of the ith-stage rotor, $S_{rj-1}$ is the rotation matrix of the j–1th-stage rotation stator reference plane rotating around a Z axis for an angle $\theta_{rj-1}$, and $S_{r1}$ is unit matrix;

second step, performing vector addition on the amount of unbalance of a single-stage rotor and the amount of unbalance introduced by an eccentricity error during the assembly process to obtain the amount of unbalance of any stage of rotor for n rotors assembly;

third step, performing vector superposition on the amount of unbalance of all stages of rotors to obtain an initial amount of unbalance of a multi-stage rotor;

fourth step, determining an interface cross sectional moment of inertia I of an inter-rotor assembly contact surface for n rotors assembly, the cross sectional moment of inertia I being:

$$I = \pi*(R^4 - r^4)/64 - 2*\int_0^{de}\int_0^{d\theta} \pi*(R^4 - r^4)/64 \, de \, d\theta$$

where R is the outer diameter of the contact surface, r is an inner diameter of the contact surface, the eccentricity is $de = \sqrt{(dx_{0-n})^2 + (dy_{0-n})^2}$, the eccentricity angle is arctan $(dy_{0-n}/dx_{0-n})$, and the bending stiffness is EI, where E is the elasticity modulus of a material;

fifth step, determining an equation of motion of rotor axis elements in a fixed coordinate system as:

$$(M_T^e + M_R^e)\ddot{q}^e - \Omega G^e \dot{q}^e + K_B^e q^e = Q^e$$

where $M_T^e$ represents mass matrix, $M_R^e$ represents inertia matrix, $G^e$ is gyro effect matrix, $\Omega$ is rotor rotation angular velocity, $q^e$ is generalized displacement vector, $K_B^e$ is stiffness matrix, $Q^e$ represents external force applied to a system, and the superscript e represents axis elements; and sixth step, combining the fourth and fifth steps to obtain the cross sectional moment of inertia I and the equation of motion of rotor axis elements in a fixed coordinate system, forming the stiffness matrix by the bending stiffness, and solving dynamic response parameters of a rotor system by a finite element method, so as to obtain the relationship between the dynamic response parameters and eccentricity errors and the amount of unbalance of all stages of rotors.

The beneficial effects of the present invention are as follows:

The stage-by-stage measurement, regulation and distribution method for dynamic characteristics of multi-stage components of large-scale high-speed rotary equipment based on multi-biased error synchronous compensation provided by the present invention takes actual structural characteristics of an engine into consideration, uses an assembly phase as a control variable, takes the influence of an inter-rotor cross sectional moment of inertia into consideration under the conditions of a cross sectional balance and a slow speed (50% of a maximum speed), takes five parameter components namely a rotor eccentricity, a sensor probe offset, a sensor ball radius, a rotor measurement plane tilt and a sensor tilt in circular contour measurement into consideration, establishes a five-parameter circular contour measurement model, and may accurately estimate an eccentricity error. High-speed response parameters are changed by rotating the assembly phase, when an optimal assembly phase is selected, high-speed vibration response critical speed parameters are obtained by solving a system dynamics equation, and a critical speed and a rotor working speed are prevented from coinciding during design, so that high-speed response parameters are optimized for n rotors assembly, and a high-speed response to a multi-stage rotor of an aero-engine can be optimized.

DETAILED DESCRIPTION OF THE INVENTION

The present invention is further illustrated by the following specific examples, but the present invention is not limited by the examples.

Example 1

A stage-by-stage measurement, regulation and distribution method for dynamic characteristics of multi-stage components of large-scale high-speed rotary equipment based on multi-biased error synchronous compensation includes: firstly, establishing a single-stage rotor five-parameter circular contour measurement model, including an eccentricity error of a single-stage rotor to be measured, a sensor probe offset, a sensor ball radius, a measurement plane tilt error and a sensor tilt error; when the eccentricity error is $e/r_0 < 10^{-3}$ with respect to a short axis of a fitted ellipse, simplifying the five-parameter circular contour measurement model by using a distance $r_i$ from an ith sampling point of the ellipse to a geometry center to obtain a simplified five-parameter circular contour measurement model; then, taking actually measured circular contour data into the simplified five-parameter circular contour measurement model to determine a relationship between dynamic response parameters after rotor assembly and eccentricity errors as well as the amount of unbalance of all stages of rotors; and finally, setting a rotor speed according to the relationship between the dynamic response parameters after rotor assembly and the eccentricity errors as well as the amount of unbalance of all stages of rotors to obtain a critical speed parameter objective function, the high-speed response critical speed parameters for n rotors assembly are optimized by adjusting assembly phases of all stages of rotors, so that a high-speed response to a multi-stage rotor of an aero-engine can be optimized.

Figure 1:
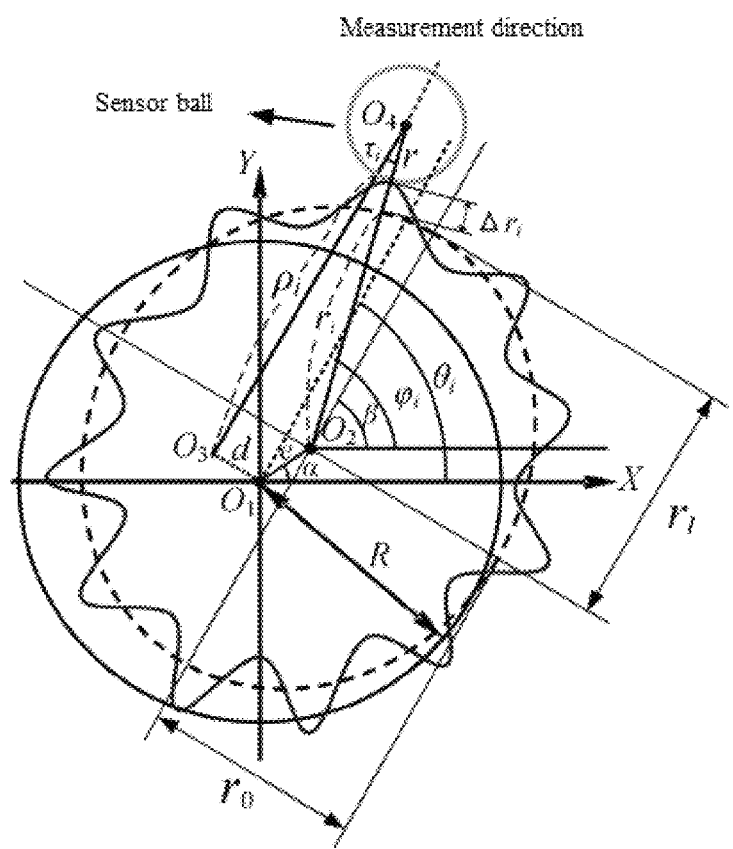
FIG. 1 is a five-parameter circular contour measurement model of the present invention, where e is rotor eccentricity, $\alpha$ is rotor eccentricity angle, $O_1$ is measured center of rotation, $O_2$ is rotor geometry center, R is sensor zero indication radius, for an ith measurement point, $\rho_i$ is the distance from a sensor probe to the measured center of rotation $O_1$, $r_i$ is the distance from an ith sampling point of a fitted ellipse to a geometry center, $\Delta r_i$ is rotor surface machining error, $\theta_i$ is the sampling angle with respect to the center of rotation $O_1$, $\varphi_i$ is the sampling angle with respect to the geometry center $O_2$, $O_3$ is rotor instantaneous center of rotation, d is sensor probe offset, $O_4$ is sensor ball radius center, r is sensor ball radius, $\tau_i$ is the included angle between a measurement direction and a rotor geometry center direction, $r_0$ is the short axis of the fitted ellipse, $r_1$ is the long axis of the fitted ellipse, and $\beta$ is the included angle between a projection of a geometry axis on a measurement plane and an initial measurement direction.
Figure 2:
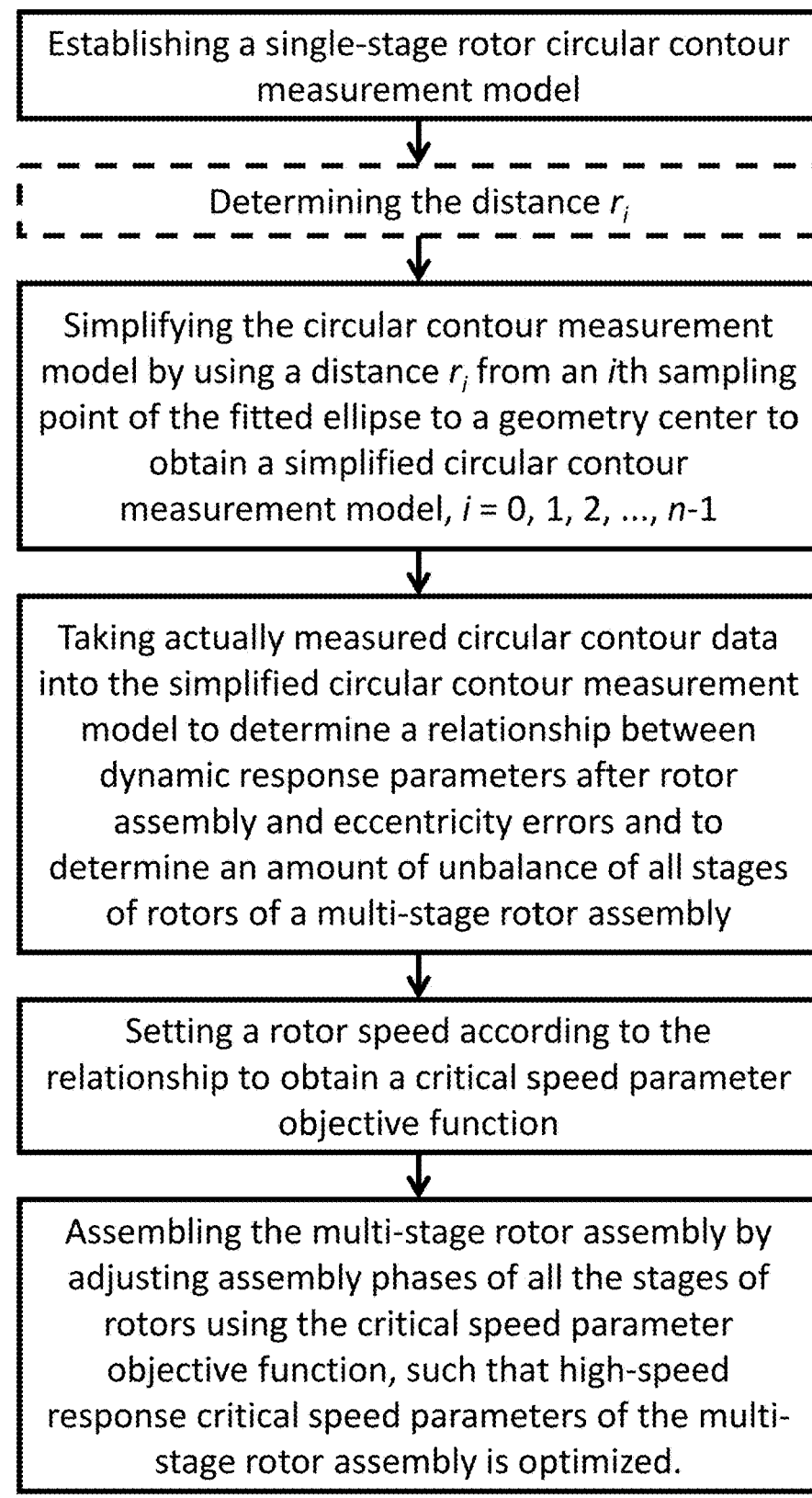
FIG. 2 is flowchart for a method according to an embodiment.

A specific process of the measurement, regulation and distribution method includes:

Step 1: Establish a single-stage rotor five-parameter circular contour measurement model, as shown in FIG. 1, a measurement equation of the five-parameter circular contour measurement model being:

$$\rho_i = \sqrt{(r+\Delta r_i + r_i)^2 - (d+e\sin(\theta_i - \alpha))^2} + e\cos(\theta_i - \alpha) - r_{i=0,1,2,\ldots n-1}$$

where $\rho_i$ is the distance from a sensor probe to a measured center of rotation, e is rotor eccentricity, $\theta_i$ is the sampling angle with respect to the center of rotation, $\alpha$ is rotor eccentricity angle, r is sensor ball radius, n is the number of sampling points, $r_i$ is the distance from an ith sampling point of a fitted ellipse to a geometry center, $\Delta r_i$ is rotor surface machining error, and d is sensor probe offset;

Step 2: Determining a distance $r_i$ from an ith sampling point of a fitted ellipse to a geometry center, an expression of the distance $r_i$ being:

$$r_i = r_0\sqrt{\frac{\cos^2(\varphi_i - \beta)}{\cos^2(\gamma + \chi)} + \sin^2(\varphi_i - \beta)}$$

where $r_0$ is the short axis of the fitted ellipse, $\varphi_i$ is the sampling angle with respect to the geometry center, $\beta$ is the included angle between a projection of a geometry axis on a measurement plane and an initial measurement direction, $\gamma$ is the included angle between an axis of rotation and the geometry axis, and $\chi$ is sensor tilt angle.

Step 3: When an eccentricity error is $e/r_0 < 10^{-3}$ with respect to the short axis of the fitted ellipse, expand the measurement equation described in step 1 by power series to obtain a simplified five-parameter circular contour measurement model:

$$\begin{cases} \rho_i = e\cos(\theta_i - \alpha) + \Delta r_i + \xi_i - \dfrac{(d + e\sin(\theta_i - \alpha))^2}{2(r + \Delta r_i + \xi_i)} \\ \xi_i = r_0\sqrt{\dfrac{\cos^2(\eta_i)}{\cos^2(\gamma + \chi)} + \sin^2(\eta_i)} \\ \eta_i = \theta_i + \arcsin\left(\dfrac{d + e\sin(\theta_i - \alpha)}{r + r_0 + \Delta r_i}\right) - \beta \end{cases}, i = 0, 1, 2, \ldots n-1.$$

Step 4: Take actually measured circular contour data into the simplified five-parameter circular contour measurement model, estimate a single-stage rotor eccentricity error by using the simplified five-parameter circular contour measurement model, so as to obtain influence of the single-stage rotor eccentricity error on the amount of unbalance after steering gear rotor assembly and determine an initial amount of unbalance for n rotors assembly, and then determine a relationship between dynamic response parameters after rotor assembly and eccentricity errors as well as the amount of unbalance of all stages of rotors through the initial amount of unbalance for n rotors assembly.

Step 5: Set a rotor speed as a slow speed to obtain a critical speed parameter objective function, the high-speed response critical speed parameters for n rotors assembly are optimized by adjusting assembly phases of all stages of rotors, so that a high-speed response to a multi-stage rotor of an aero-engine can be optimized, where the slow speed is 50% of a maximum speed.

The process of determining the relationship between dynamic response parameters after rotor assembly and eccentricity errors as well as the amount of unbalance of all stages of rotors in step 4 includes:

First step: during multi-stage rotor assembly, single-stage rotor eccentricity errors can be propagated and accumulated to affect the amount of unbalance for n rotors assembly, wherein the amount of unbalance of the nth-stage rotor caused by eccentricity errors of all stages of rotors is determined, the amount of unbalance of the nth-stage rotor caused by the eccentricity errors of all stages of rotors being:

$$\begin{bmatrix} Ux_{0-n} \\ Uy_{0-n} \end{bmatrix} = \begin{bmatrix} m_{0-n} & 0 & 0 \\ 0 & m_{0-n} & 0 \end{bmatrix} \cdot \sum_{i=1}^{n}\left(\prod_{j=2}^{i} S_{rj-1}S_{xj-1}S_{yj-1}\right)S_{ri}(p_i + dp_i)$$

where $Ux_{0-n}$ is the amount of unbalance of a measurement plane of an assembled nth-stage rotor in an X-axis direction, $Uy_{0-n}$ is the amount of unbalance of the measurement plane of the assembled nth-stage rotor in a Y-axis direction, $m_{0-n}$ is the mass of the assembled nth-stage rotor, $p_i$ is the ideal position vector of a center of a radial measurement plane of an ith-stage rotor, $dp_i$ is the machining error vector of a center position of the radial measurement plane of the ith-stage rotor, $S_{ri}$ is the rotation matrix of the ith-stage rotor rotating around a Z axis for an angle $\theta_{rj}$, $S_{r1}$ is a unit matrix, $S_{xj-1}$ is the rotation matrix of a j−1th-stage rotation stator reference plane rotating around an X axis for an angle $\theta_{xj-1}$, $S_{yj-1}$ is the rotation matrix of the j−1th-stage rotation stator reference plane rotating around a Y axis for an angle $\theta_{yj-1}$, $p_i$ is the ideal position vector of a center of a radial measurement plane of an ith-stage rotor, $dp_i$ is the machining error vector of a center position of the radial measurement plane of the ith-stage rotor, $S_{rj-1}$ is the rotation matrix of the j−1th-stage rotation stator reference plane rotating around a Z axis for an angle $\theta_{rj-1}$, and $S_{r1}$ is unit matrix.

Second step: Perform vector addition on the amount of unbalance of a single-stage rotor and the amount of unbalance introduced by an eccentricity error during the assembly process to obtain the amount of unbalance of any stage of rotor for n rotors assembly.

Third step: Perform vector superposition on the the amount of unbalance of all stages of rotors to obtain an initial amount of unbalance of a multi-stage rotor, so as to achieve the calculation of the initial amount of unbalance of the multi-stage rotor.

Fourth step: Determine an interface cross sectional moment of inertia I of an inter-rotor assembly contact surface for n rotors assembly, the cross sectional moment of inertia I being:

$$I = \pi * (R^4 - r^4)/64 - 2 * \int_0^{de} \int_0^{d\theta} \pi * (R^4 - r^4)/64 \, de \, d\theta$$

where R is the outer diameter of the contact surface, r is an inner diameter of the contact surface, the eccentricity is $de = \sqrt{(dx_{0-n})^2 + (dy_{0-n})^2}$, the eccentricity angle is $\arctan(dy_{0-n}/dx_{0-n})$, and the bending stiffness is EI, where E is the elasticity modulus of a material;

Fifth step: Determining an equation of motion of rotor axis elements in a fixed coordinate system as:

$$(M_T^e + M_R^e)\ddot{q}^e - \Omega G^e \dot{q}^e + K_B^e q^e = Q^e$$

where $M_T^e$ represents mass matrix, $M_R^e$ represents inertia matrix, $G^e$ is gyro effect matrix, $\Omega$ is rotor rotation angular velocity, $q^e$ is generalized displacement vector, $K_B^e$ is stiffness matrix, $Q^e$ represents external force applied to a system, and the superscript e represents axis elements.

Sixth step: Combine the fourth and fifth steps to obtain the cross sectional moment of inertia I and the equation of motion of rotor axis elements in a fixed coordinate system, forming the stiffness matrix by the bending stiffness, and solving dynamic response parameters of a rotor system by a finite element method, so as to obtain the relationship between the dynamic response parameters and eccentricity errors and the amount of unbalance of all stages of rotors.

Although the present invention has been disclosed in the above preferred examples, the present invention is not limited thereto, and any person skilled in the art can make various changes and modifications without departing from the spirit and scope of the present invention. Therefore, the scope of protection of the present invention should be determined by the claims.

The invention claimed is:

1. A method comprising:
    establishing a single-stage rotor circular contour measurement model, the model comprising an eccentricity error of a single-stage rotor, a sensor probe offset, a sensor ball radius, a measurement plane tilt error and a sensor tilt error;
    when the eccentricity error is $e/r_0 < 10^{-3}$ with respect to a short axis of a fitted ellipse, simplifying the circular contour measurement model by using a distance $r_i$ from an ith sampling point of the fitted ellipse to a geometry center to obtain a simplified circular contour measurement model, $i = 0, 1, 2, \ldots, n-1$, where e is rotor eccentricity of the single-stage rotor and $r_0$ is the short axis of the fitted ellipse;
    taking actually measured circular contour data into the simplified circular contour measurement model to determine a relationship between dynamic response parameters after rotor assembly and eccentricity errors and to determine an amount of unbalance of all stages of rotors of a multi-stage rotor assembly;
    setting a rotor speed according to the relationship to obtain a critical speed parameter objective function; and
    assembling the multi-stage rotor assembly by adjusting assembly phases of all the stages of rotors using the critical speed parameter objective function, such that high-speed response critical speed parameters of the multi-stage rotor assembly is optimized.

2. The method according to claim 1,
    wherein a measurement equation of the circular contour measurement model is:

$$\rho_i = \sqrt{(r + \Delta r_i + r_i)^2 - (d + e\sin(\theta_i - \alpha))^2} + e\cos(\theta_i - \alpha) - r \quad i=0,1,2,\ldots n-1$$

where $\rho_i$ is a distance from a sensor probe to a measured center of rotation, e is rotor eccentricity, $\theta_i$ is a sampling angle with respect to the measured center of rotation, $\alpha$ is a rotor eccentricity angle, r is the sensor ball radius, n is a number of sampling points, $\Delta r_i$ is a rotor surface machining error, and d is the sensor probe offset;
    wherein the method further comprises determining the distance $r_i$, where the distance $r_i$ being expressed as:

$$r_i = r_0 \sqrt{\frac{\cos^2(\varphi_i - \beta)}{\cos^2(\gamma + \chi)} + \sin^2(\varphi_i - \beta)}$$

where $\varphi_i$ is a sampling angle with respect to the geometry center, $\beta$ is an included angle between a projection of a geometry axis on a measurement plane and an initial measurement direction, $\gamma$ is an included angle between an axis of rotation and the geometry axis, and $\chi$ is a sensor tilt angle;
    wherein simplifying the circular contour measurement model comprises expanding the measurement equation by a power series to obtain the simplified circular contour measurement model expressed as:

$$\begin{cases} \rho_i = e\cos(\theta_i - \alpha) + \Delta r_i + \xi_i - \dfrac{(d + e\sin(\theta_i - \alpha))^2}{2(r + \Delta r_i + \xi_i)} \\ \xi_i = r_0 \sqrt{\dfrac{\cos^2(\eta_i)}{\cos^2(\gamma + \chi)} + \sin^2(\eta_i)} \\ \eta_i = \theta_i + \arcsin\left(\dfrac{d + e\sin(\theta_i - \alpha)}{r + r_0 + \Delta r_i}\right) - \beta \end{cases}, i = 0, 1, 2, \ldots n-1;$$

wherein taking actually measured circular contour data into the simplified circular contour measurement model to determine the relationship between dynamic response parameters after rotor assembly and eccentricity errors and to determine the amount of unbalance of all stages of rotors of the multi-stage rotor assembly comprises: estimating a single-stage rotor eccentricity error by using the simplified circular contour measurement model, so as to obtain influence of the single-stage rotor eccentricity error on the amount of unbalance and to determine an initial amount of unbalance for the multi-stage rotor assembly, and then determining the relationship between dynamic response parameters after rotor assembly and eccentricity errors and determining the amount of unbalance of all stages of rotors using the initial amount of unbalance.

3. The method according to claim 2, wherein taking actually measured circular contour data into the simplified circular contour measurement model to determine the relationship between dynamic response parameters after rotor assembly and eccentricity errors and to determine the amount of unbalance of all stages of rotors of the multi-stage rotor assembly comprises:

determining an amount of unbalance of an nth-stage rotor caused by eccentricity errors of all stages of rotors, the amount of unbalance of the nth-stage rotor caused by the eccentricity errors of all stages of rotors being:

$$\begin{bmatrix} Ux_{0\text{-}n} \\ Uy_{0\text{-}n} \end{bmatrix} = \begin{bmatrix} m_{0\text{-}n} & 0 & 0 \\ 0 & m_{0\text{-}n} & 0 \end{bmatrix} \cdot \sum_{i=1}^{n} \left( \prod_{j=2}^{i} S_{rj-1} S_{xj-1} S_{yj-1} \right) S_{ri}(p_i + dp_i)$$

where $Ux_{0\text{-}n}$ is an amount of unbalance of a measurement plane of an assembled nth-stage rotor in an X-axis direction, $Uy_{0\text{-}n}$ is an amount of unbalance of the measurement plane of the assembled nth-stage rotor in a Y-axis direction, $m_{0\text{-}n}$ is a mass of the assembled nth-stage rotor, $p_i$ is an ideal position vector of a center of a radial measurement plane of an ith-stage rotor, $dp_i$ is a machining error vector of a center position of the radial measurement plane of the ith-stage rotor, $S_{ri}$ is a rotation matrix of the ith-stage rotor rotating around a Z axis for an angle $\vartheta_{ri}$, $S_{xj-1}$ is a rotation matrix of a j−1th-stage rotation stator reference plane rotating around an X axis for an angle $\vartheta_{xj-1}$, $S_{yj-1}$ is a rotation matrix of the j−1th-stage rotation stator reference plane rotating around a Y axis for an angle $\vartheta_{yj-1}$, $S_{rj-1}$ is a rotation matrix of the j−1th-stage rotation stator reference plane rotating around a Z axis for an angle $\vartheta_{rj-1}$, and $S_{r1}$ is a unit matrix;

performing vector addition on an amount of unbalance of a single-stage rotor and an amount of unbalance introduced by an eccentricity error during an assembly process to obtain an amount of unbalance of any stage for n rotors assembly;

performing vector superposition on the amount of unbalance of all stages of rotors to obtain an initial amount of unbalance of a multi-stage rotor;

determining an interface cross sectional moment of inertia I of an inter-rotor assembly contact surface for n rotors assembly, the cross sectional moment of inertia I being:

$$I = \pi*(R^4-r^4)/64 - 2*\int_0^{de}\int_0^{d\theta}\pi*(R^4-r^4)/64 \, de \, d\theta$$

where R is an outer diameter of the inter-rotor assembly contact surface, r is an inner diameter of the inter-rotor assembly contact surface, the eccentricity is $de = \sqrt{(dx_{0\text{-}n})^2 + (dy_{0\text{-}n})^2}$, the rotor eccentricity angle is arctan $(dy_{0\text{-}n}/dx_{0\text{-}n})$, and a bending stiffness is EI, where E is an elasticity modulus of a material, $dx_{0\text{-}n}$ and $dy_{0\text{-}n}$ are respectively components of the rotor eccentricity of the nth-stage rotor along the X-axis direction and the Y-axis direction;

determining an equation of motion of rotor axis elements in a fixed coordinate system as:

$$(M_T^e + M_R^e)\ddot{q}^e - \Omega G^e \dot{q}^e + K_B^e q^e = Q^e$$

where $M_T^e$ represents mass matrix, $M_R^e$ represents inertia matrix, $G^e$ is gyro effect matrix, $\Omega$ is rotor rotation angular velocity, $q^e$ is generalized displacement vector, $K_B^e$ is stiffness matrix, $Q^e$ represents external force applied to a system, and the superscript e represents axis elements; and combining the fourth and fifth steps to obtain the cross sectional moment of inertia I and the equation of motion of rotor axis elements in a fixed coordinate system, forming the stiffness matrix by the bending stiffness, and solving dynamic response parameters of a rotor system by a finite element method, so as to obtain the relationship between the dynamic response parameters and eccentricity errors and the amount of unbalance of all stages of rotors.

* * * * *